(12) United States Patent
Sundstrom

(10) Patent No.: US 7,462,939 B2
(45) Date of Patent: Dec. 9, 2008

(54) INTERPOSER FOR COMPLIANT INTERFACIAL COUPLING

(75) Inventor: Lance L. Sundstrom, Pinellas Park, FL (US)

(73) Assignee: Honeywell International Inc., Morristown, NJ (US)

( * ) Notice: Subject to any disclaimer, the term of this patent is extended or adjusted under 35 U.S.C. 154(b) by 133 days.

(21) Appl. No.: 11/254,512

(22) Filed: Oct. 20, 2005

(65) Prior Publication Data

US 2007/0090506 A1    Apr. 26, 2007

(51) Int. Cl.
*H01L 23/52* (2006.01)
*H01L 23/48* (2006.01)
*H01L 29/40* (2006.01)

(52) U.S. Cl. ............... 257/778; 257/E23.068; 257/685; 257/723; 257/737; 174/260; 174/262; 29/843

(58) Field of Classification Search .......... 257/E23.063, 257/E23.067, 686, 685, 723, 778, 737; 174/260, 174/262; 439/65; 29/843; 361/799
See application file for complete search history.

(56) References Cited

U.S. PATENT DOCUMENTS

| | | | | |
|---|---|---|---|---|
| 5,477,933 A * | 12/1995 | Nguyen | ................. | 174/262 |
| 5,639,389 A | 6/1997 | Schmidt et al. | | |
| 5,729,897 A | 3/1998 | Schmidt et al. | | |
| 5,915,169 A * | 6/1999 | Heo | ................. | 438/118 |
| 5,953,816 A | 9/1999 | Pai et al. | | |
| 5,990,546 A * | 11/1999 | Igarashi et al. | ................. | 257/700 |
| 6,086,386 A * | 7/2000 | Fjelstad et al. | ................. | 439/70 |
| 6,163,462 A * | 12/2000 | Buck | ................. | 361/767 |
| 6,333,469 B1 * | 12/2001 | Inoue et al. | ................. | 174/260 |
| 6,333,563 B1 | 12/2001 | Jackson et al. | | |
| 6,335,491 B1 | 1/2002 | Alagaratnam et al. | | |
| 6,376,769 B1 * | 4/2002 | Chung | ................. | 174/524 |
| 6,414,248 B1 * | 7/2002 | Sundstrom | ................. | 174/260 |
| 6,462,421 B1 * | 10/2002 | Hsu et al. | ................. | 257/777 |
| 6,486,394 B1 | 11/2002 | Schmidt et al. | | |
| 6,492,715 B1 * | 12/2002 | Markovich et al. | ................. | 257/678 |
| 6,507,118 B1 * | 1/2003 | Schueller | ................. | 257/778 |
| 6,657,134 B2 | 12/2003 | Spielberger et al. | | |
| 6,723,927 B1 | 4/2004 | Fan et al. | | |
| 6,791,035 B2 | 9/2004 | Pearson et al. | | |
| 7,115,818 B2 * | 10/2006 | Kusano et al. | ................. | 174/254 |
| 2003/0102156 A1 * | 6/2003 | Spielberger et al. | ................. | 174/260 |
| 2005/0023033 A1 * | 2/2005 | Saiki et al. | ................. | 174/260 |

OTHER PUBLICATIONS

Dyconex Advanced Circuit Technology brochure, Dyconex Ltd., Bassersdorf, Switzerland, 3 pages, Sep. 7, 2004.

* cited by examiner

*Primary Examiner*—Chris C. Chu
(74) *Attorney, Agent, or Firm*—Fogg & Powers LLC

(57) ABSTRACT

In one aspect, the present invention provides interposers that can mechanically, electrically, and thermally interconnect first and second microelectronic components. An interposer in accordance with the present invention includes a substrate, preferably flexible, having first and second oppositely facing surfaces. Such interposers also include an array of links traversing from the first surface of the substrate to the second surface of the substrate. In accordance with the present invention, each link preferably comprises a buried portion positioned between the first and second surfaces of the substrate. In other aspects of the present invention, microelectronic assemblies having first and second microelectronic components interconnected by an interposer and methods of interconnecting such components are provided.

25 Claims, 6 Drawing Sheets

INTERPOSER FOR COMPLIANT INTERFACIAL COUPLING

TECHNICAL FIELD

The present invention relates to the fabrication and assembly of microelectronic devices and related components. More particularly, the present invention relates to interposers that are used for compliant interfacial coupling of microelectronic devices and related components.

BACKGROUND

In microelectronic device manufacturing, a bare microelectronic integrated circuit (IC) die, or chip, is often coupled directly to a host printed circuit board (PCB) or first coupled to a host electronic package, which in turn is coupled to a host PCB. The package serves to protect the die and can provide a standardized interface between the die and the system in which it will be used. The packaged IC die is subsequently mounted to a PCB, such as a daughterboard or a motherboard in a computer system or the like.

One common technique for packaging an IC die involves mounting the die on a die attach pad of a leadframe having leads that extend outward from one or more sides of the die attach pad. This is typically the case for plastic and some ceramic packages. In some other ceramic packages, the leadframe is attached to the exterior of the ceramic package body and the die is attached and wire bonded to pads connected to the external leadframe. When mounted to the leadframe, the back of the die is electrically connected to the die attach pad and the front peripheral bond pads of the die are connected to the leads of the leadframe by bond wires which provide a mechanically compliant connection that is not affected by thermal expansion and contraction of the package body, leadframe, and die.

Generally, a peripheral bond wire interface between an IC die and a host package or PCB is compliant, but an interfacial bond between a flip-chip die and a host package or PCB is usually not. This is because the short aspect ratio (ratio of length divided by cross-sectional area) of the interfacial connections between a flip-chip die and a host package or PCB cause them to be very stiff and not very tolerant of thermal coefficient of expansion (TCE) differences between the die and package or PCB material or of any interfacial interface distortions due to flexure of the package or PCB from acceleration, mechanical shock, vibration, or the like. The same is generally true of short interfacial connections between an electronic package and its host PCB.

Ultimately, the leadframe and die are encapsulated with a ceramic or plastic material so that the leads of the leadframe extend out of the package and are accessible. One common through-hole package is known as a dual-in-line package (DIP), which is rectangularly shaped with an equal number of leads extending from two opposite sides. Dual flat pack (DFP) and quad flat pack (QFP) are common surface mount technology (SMT) packages and are typically rectangular or square having planar leads distributed around their periphery on two opposite or all four sides, respectively. As to the encapsulation materials, ceramics are usually used, where reliability and a hermitic seal are required such as for military and space qualified applications. Plastics are usually used for commercial products where it is desired to minimize cost and where a hermetic seal is not required such as for consumer, automotive, and industrial applications.

An electronic package including a die can then be bonded or otherwise electrically, thermally, and/or mechanically attached to a printed circuit board. Typically, a surface-mount technology assembly process is used which involves attaching the leads (and optionally the body) of the package to attach pads on the surface of the printed circuit board. Solder, conductive and/or non-conductive polymers are typically used. The leads are typically attached by screen-printing solder or polymer paste onto the attach pads, positioning the leads of the package relative to the attach pads, and then reflowing the solder by a vapor phase or infra-red reflow technique or curing the polymer paste in a oven. The attach pads of the printed circuit board are connected to traces or wires that provide a mechanical, thermal, and/or an electrical connection to other integrated circuits or electronic devices.

As technology has advanced, the size and circuit density of microelectronic integrated circuit chips have increased and the number of leads used in connecting such chips has correspondingly increased. This trend is expected to continue. Using conventional bond wire and packaging techniques with peripheral leads, the package footprint area (proportional to the product of length and width) increases faster than the lead count (proportional to the sum of length and width). This results in a reduction of the interconnect density with increasing lead count in peripheral leaded packages. To overcome this problem, as illustrated in FIG. 1, a chip device 10, such as a bare (e.g., flip chip) or packaged device, is connected to a printed circuit board 12 by using an interfacial connection area array 14 rather than extending peripheral bond wires or leads as described above. Area array device packages include ball grid arrays (BGAs), land grid arrays (LGAs), and column grid arrays (CGAs), for example, and may comprise regular grids or irregular arrays. The area array 14 provides a means of mechanically attaching a bare or packaged chip device 10 to a printed circuit board 12. Additionally, the area array 14 provides a means of electrical and/or thermal interconnection between an attach pad 16 of a package or printed circuit board 12 and an attach pad 18 of a bare or packaged chip device 10. Typically, solder or polymer bumps or balls comprise the interfacial connection area array 14 of the bare or packaged chip device 10. The area array 14 of the bare or packaged chip device 10 is then aligned with the attach pads 16 of the printed circuit board 12 and bonded in place. In this way, an interfacial area array interconnect increases interconnect density and reduces bare or packaged device size. Unlike peripheral leaded packages, the interconnect density of area array packages remains fairly constant with increasing interconnect counts.

Although the use of an interfacial area array to interconnect a bare or packaged chip and a package or printed circuit board overcomes the space issues noted above, the interfacial solder joints connecting these area arrays are more susceptible to thermal coefficient of expansion mismatch than with conventional peripheral bond wires or package leads. The relative displacement between a pair of mating attach pads is proportional to their distance from a neutral point at the center of the array, the TCE difference between the mating surfaces, and the temperature. This problem is particularly noticeable as the size of the area array increases. When undergoing thermal cycling, the TCE mismatch between the bare die and the package and/or between the package and the printed circuit board produces stress on the solder joints of the area array(s). This stress can cause microcracks to form in the joints, which eventually causes them to fail. Moreover, such microcracks can arise from stresses caused by distortions of the interfacial interface due to acceleration, mechanical shock, or vibration.

Plastic packages used in commercial products exhibit a thermal coefficient of expansion close to that of a standard epoxy-based printed circuit board material, which is approximately 17 parts per million. As a result of such a close thermal coefficient of expansion match, a plastic package integrated with a printed circuit board, on average, can routinely withstand 4-5 thousand thermal cycles between minus 40 degrees Celsius and 125 degrees Celsius prior to failure of an interconnection. Conversely, ceramic packages exhibit a thermal coefficient of expansion of approximately 7 ppm. This causes a large thermal coefficient of expansion mismatch between a ceramic package and printed circuit board. Such mismatch causes stresses that can reduce the reliability of an interfacial interconnection between a ceramic package and printed circuit board to 100 thermal cycles or less.

Several different techniques have been developed to improve the reliability of ceramic packages. For example, crack resistant alloys have been developed. However, these alloys only improve reliability to 200-400 cycles. Also, solder columns that are 3-4 times taller than conventional solder balls have been used. This allows the joints to flex and absorb some of the stress so that the package can withstand upwards of 1000 thermal cycles. However, the solder columns are very fragile and susceptible to breakage during packaging, handling and assembly. In another approach, printed circuit boards have been fabricated with a metal core to help to reduce the thermal mismatch. However, these printed circuit boards are expensive to produce and suffer from other problems related to their ability to reflow solder. Ceramic boards can be used but are limited in size and are also very expensive. All of the above address compliance in the X-Y plane (parallel to the die, package and PCB planes) to accommodate TCE mismatch. None of the above address the Z axis compliance (perpendicular or normal to the die, package and PCB plane) needed to accommodate distortions of the interfacial area array interface such as printed circuit board flexure due to acceleration, mechanical shock and vibration.

As illustrated in FIG. 2, one technique for managing a large thermal mismatch between a bare or packaged chip 20 or other electrical component and a package or printed circuit board 22 is to use an interposer 24. The interposer 24 is positioned between the bare or packaged chip 20 and the package or printed circuit board 22 and generally comprises a flexible substrate 26 and first and second area arrays, 28 and 30, on each side of the substrate 26. The area arrays 28 and 30 provide an electrical connection from one side of the substrate 26 to the other. This is done by electrically connecting an attach pad of the first area array 28 on one side of the substrate 26 with a corresponding attach pad of the second area array 30 on the other side of the substrate 26. The area array 28 is connected to attach pads 32 of the package or printed circuit board 22 and the area array 30 is connected to attach pads 34 of the bare or packaged chip 20. In this configuration, when the bare or packaged chip 20 undergoes thermal cycling, thermal expansion stresses are absorbed by the flexible substrate 26 rather than being transferred to solder joints in an array. In this way, the vertically stacked connection arrays can flex to absorb relative X-Y plane TCE displacement between the attachment surfaces like a column grid array.

SUMMARY

The present invention provides interposers that can be functionally provided between first and second microelectronic components to form a microelectronic assembly. Such microelectronic components may include packaged chips, unpackaged chips (such as flip-chips), packages and printed circuit boards. A microelectronic assembly including any such microelectronic components and an interposer in accordance with the present invention preferably comprises first and second area arrays that mechanically, electrically and/or thermally connect the interposer to the first and second microelectronic components, respectively. An area array can comprise a regular grid or irregular array and may comprise a ball grid array, land grid array, column grid array, or the like. By providing an interposer between first and second microelectronic components in accordance with the present invention, stresses due to thermal coefficient of expansion mismatch, acceleration, mechanical shock, and vibration can be managed and device lifetime and reliability can be improved.

Interposers in accordance with the present invention can be used to adapt one interface pattern to a different interface pattern and provide compliance between such different interfaces. For example, one side of an interposer could have an array of thermally conductive and electrically insulating bonds bordered by peripheral electrically conductive bonds for interfacing to a conventional bare die. The other side of the interposer could have a regular array of electrically conductive bonds connected to the peripheral electrically conductive bonds on the other side and thermally and mechanically connected to both electrically and thermally conductive bonds on the other side. Such an interposer can be used to convert an interface pattern of a conventional die to that of a flip-chip while providing distributed mechanical support and low electrical and thermal impedance between the die and its host package or printed circuit board.

Interposers in accordance with the present invention can also be used to provide very wide X-Y-Z compliant interfacial power and ground connections between the bottom of a dual flat pack (DFP) or a quad flat pack (QFP) package and a host printed circuit board. These wide interfacial connection paths have a much lower electrical and thermal impedance compared with peripheral leads and serve to improve electrical, thermal and mechanical performance.

More particularly, one aspect of the present invention provides an interposer that can be used to mechanically, electrically, and thermally interconnect first and second microelectronic components. The interposer includes a substrate, preferably flexible, having first and second oppositely facing surfaces. The interposer also includes an array of distinct links traversing from the first surface of the substrate to the second surface of the substrate. In accordance with the present invention, each link comprises a buried conductive portion positioned between the first and second surfaces of the flexible substrate. Preferably, an interposer in accordance with the present invention also includes attach pads that have substantial adhesion to at least a portion of a respective buried portion of a conductive link. The buried conductive portions are preferably designed to be substantially larger than the attach pads and well anchored within the supporting dielectric material. This advantageously makes the attach pads mechanically stronger than surface attach pads, where strength is related to attach pad area and surface peel strength.

In another aspect of the present invention, an interposer having a substrate, an electrically conductive portion buried in the substrate, and first and second vias is provided. The interposer can be used in a microelectronic device assembly to mechanically, electrically, and thermally interconnect first and second microelectronic components. The substrate preferably comprises a flexible dielectric substrate having first and second oppositely facing surfaces. The electrically conductive portion buried in the substrate is preferably located at a predetermined position between the first and second surfaces of the substrate. The first via is formed in the substrate and extends from the first surface of the substrate to the electrically conductive portion buried in the substrate. The second via is also formed in the substrate and extends from the second surface of the substrate to the electrically conductive portion buried in the substrate. The first and second vias are preferably provided in a predetermined alignment with each other. The combination of the buried portion and first and second vias permits the pattern of vias to be different.

In another aspect of the present invention, a microelectronic device assembly is provided. The microelectronic device assembly comprises first and second microelectronic components, an interposer, and first and second area arrays. The first microelectronic component comprises a plurality of attach pads and the second microelectronic component also comprises a plurality of attach pads. The interposer is positioned between the first and second microelectronic components. The interposer comprises a substrate, preferably flexible, having a plurality of distinct links between first and second oppositely facing surfaces of the substrate. Each link of the plurality of links preferably comprises first and second vias electrically connected by an electrically conductive trace buried in the substrate. The electrically conductive trace is preferably positioned between the first and second oppositely facing surfaces of the substrate. The first area array preferably mechanically, electrically, and thermally connects the plurality of attach pads of the first microelectronic component to the plurality of links of the substrate of the interposer at the first surface of the substrate. The second area array preferably mechanically, electrically, and thermally connects the plurality of attach pads of the second microelectronic component to the plurality of links of the substrate at the second surface of the substrate.

In yet another aspect of the present invention, a method of mechanically, electrically, and/or thermally interconnecting a first microelectronic component to a second microelectronic component is provided. The method comprises providing first and second microelectronic components, providing an interposer, positioning the interposer between the first and second microelectronic components, and interconnecting the interposer with the first and second microelectronic components. The first microelectronic component preferably comprises a plurality of attach pads to be connected or otherwise bonded to a plurality of attach pads of the second microelectronic component. The interposer comprises a substrate, preferably flexible, having a plurality of distinct links between first and second oppositely facing surfaces of the flexible substrate. Each link of the plurality of links comprises first and second vias electrically connected by an electrically conductive trace buried in the substrate and positioned between the first and second oppositely facing surfaces of the flexible dielectric substrate. The step of interconnecting the interposer with the first microelectronic component comprises interconnecting at least one attach pad of the first microelectronic component with at least one of the plurality of links of the substrate of the interposer by bonding the at least one attach pad of the first microelectronic component to the buried conductive trace of the at least one of the plurality of links of the substrate. The step of interconnecting the interposer with the second microelectronic component comprises interconnecting at least one attach pad of the second microelectronic component with the at least one of the plurality of links of the substrate of the interposer by bonding the at least one attach pad of the second microelectronic component to the buried trace of the at least one of the plurality of links of the substrate. Such bonding may comprise bonding with solder, conductive polymer, nonconductive polymer or the like.

BRIEF DESCRIPTION OF THE DRAWINGS

These and other features, aspects, and advantages of the present invention will become better understood with regard to the following description, appended claims, and accompanying drawings where:

DETAILED DESCRIPTION

Figure 1:
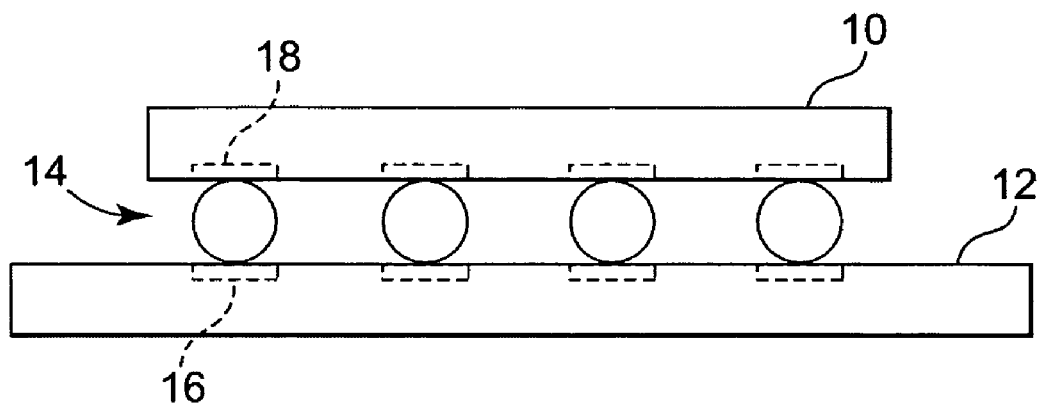
FIG. 1 is a side view of a prior art microelectronic device assembly having a first microelectronic component connected to a second microelectronic component by an interfacial connection area array.
Figure 2:
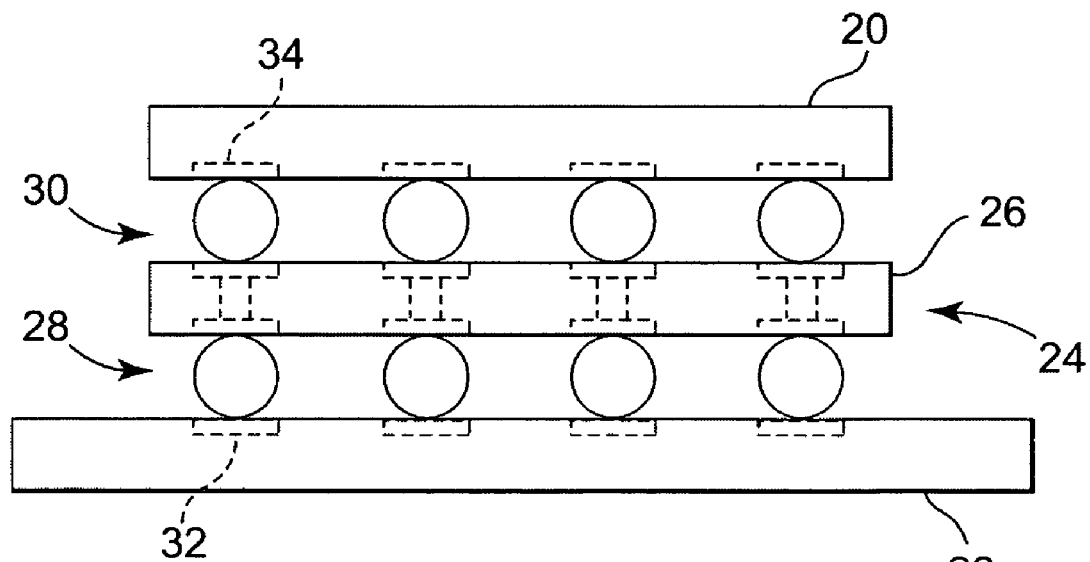
FIG. 2 is a side view of a prior art microelectronic device assembly having a first microelectronic component connected to a second microelectronic component by an interposer.
Figure 3:
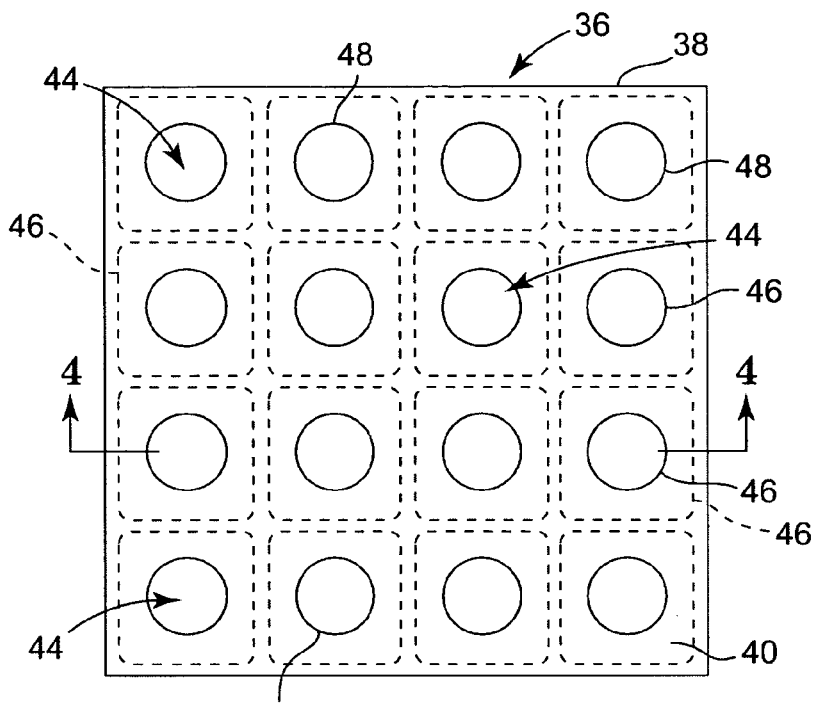
FIG. 3 is a plan view of an interposer in accordance with the present invention that can be used in the microelectronic device assembly of FIG. 2 wherein the interposer comprises a substrate having a plurality of distinct links between aligned locations on opposite sides of the substrate and the links are arranged as an array and each comprise a conductive portion buried in the substrate.
Figure 4:
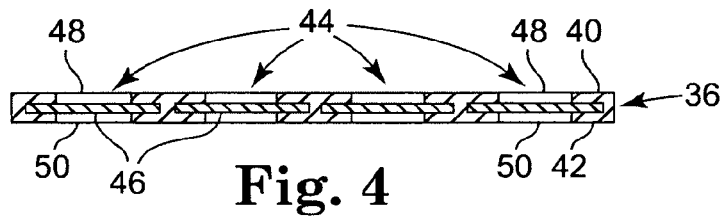
FIG. 4 is a cross-sectional view of the interposer of FIG. 3 taken along the line 4-4.

An exemplary interposer 36 in accordance with the present invention is illustrated in FIGS. 3 and 4. In FIG. 3 the interposer 36 is shown in plan view and in FIG. 4 a cross-sectional view of the interposer 36 as taken along the line 4-4 is shown. The interposer 36 generally comprises a substrate 38 having a first surface 40, a second surface 42, and a plurality of links 44 traversing between the first and second surfaces, 40 and 42. The interposer 36, as well as the other exemplary interposers in accordance with the present invention described and suggested below, can be designed to mechanically, electrically, and/or thermally interconnect a first microelectronic component to a second microelectronic component in a microelectronic device assembly such as the microelectronic device assembly of FIG. 2 described above. Interposers in accordance with the present invention can be used for die-level and package-level electronic assembly. Moreover, such interposers can be used to provide an array of compliant interfacial mechanical, electrical, and/or thermal bonds or links between any two surfaces or devices where such compliance is desired such as to manage thermal expansion mismatch or exposure to certain loading conditions.

The material composition of the substrate 38 of the interposer 36, as well as that of the substrates of the other interposers described below, is preferably flexible and may comprise a polyimide or similar dielectric material. Other materials such as polyester, polytetrafluoroethylene (sold commercially under the tradename "Teflon® PTFE"), polyvinyl fluoride (sold commercially under the tradename "Tedlar® PVF"), or nylon, for example, can be used. Any material can be used based upon a particular application and the need for dielectric properties, flexibility, temperature, and the like. The term flexible as used herein relates to the ability of a material to elastically stretch, compress, and/or deflect in response to a particular loading condition without plastic deformation. In this regard, the material for the substrate 38 is preferably selected so that the force necessary to stretch, compress, or otherwise deform or deflect the substrate 38 with respect to an operative connection or bond between one or more of the links 44 and a component of a microelectronic device assembly is less than the force necessary to fatigue or break such connection or bond. This is the condition where the substrate 38 can absorb distortions in the plane of the substrate 38 (X-Y axes) due to temperature coefficient of expansion mismatch as well as distortions in the plane of the substrate 38 and across the thickness of the substrate 38 (Z axis) due to acceleration, mechanical shock, vibration, and the like.

As shown, each link 44 of the plurality of links comprises a conductive portion 46 buried in the substrate 38 and positioned between the first and second surfaces 40 and 42, respectively, of the substrate 38. In this embodiment, a first via 48 extends from the first surface 40 of the substrate 38 to the conductive portion 46, and a second via 50 extending from the second surface 42 of the substrate 38 to the conductive portion 46. Preferably, the conductive portions 46 comprise a buried or embedded conductive material such as copper or the like to provide an electrically and thermally conductive link where electrical and/or thermal conductivity is desired.

The links 44, as well as those described and suggested below, can be designed to be electrically and thermally conductive (or both insulating) or thermally conductive and electrically insulating (or vice versa). Each link can provide an electrical, thermal, and mechanical connection (e.g. with solder or an electrically conductive polymer), a thermal and mechanical connection (e.g. with an thermally conductive and electrically insulating polymer) or a mechanical connection (e.g. with an electrically and thermally non-conductive polymer). For example, a combination of peripheral electrically conducive bonds and thermally conductive and electrically insulating bonds could be used to bond one side of an interposer in accordance with the present invention to a conventionally known or future developed bare integrated circuit chip or die. Any arrangements of a combination of such bonds are contemplated, such as providing the electrically conductive bonds in a peripheral pattern surrounding thermally conductive or mechanical bonds. The other side of the interposer could be bonded to an electronic package or a printed circuit board with an array of electrically conductive bonds or any combination of such types. This flexibility permits designs that advantageously can adapt a conventional bare integrated circuit chip or die with peripheral wire bond pads for flip chip attachment while providing a compliant mechanical, electrical, and thermal interface in accordance with an aspect of the present invention.

Preferably, such a buried conductive portion 46 of a link 44 is designed so that the buried conductive portion 46 is larger than the first and second vias 48 and 50, respectively. Such a buried conductive portion 46 is thus well anchored or embedded within the substrate 38. In this way, the buried conductive portion can provide greater mechanical strength as compared to a surface trace or pad where such strength is generally limited to the strength of the interface between such a surface pad and the surface to which it is adhered. That is, the peel or pull strength of a connection made to such a surface pad is limited by the peel or pull strength of the surface pad itself. Surface pad peel strength is the force necessary to initiate and propagate a peeling action starting from the edge of the pad and is proportional to pad width. Pull strength is the force necessary to remove the entire pad all at once and is proportional to pad area. Because the buried traces in accordance with the present invention are larger than the attach pads, a peeling action cannot be initiated and the pull strength of the attach pads approaches that of the larger buried trace. The buried conductive portions of a link in accordance with the present invention are not limited to surface pad peel or pull strength because such conductive portions are buried or embedded within the substrate material. Such increased peel and pull strength of buried conductive portions 46 in accordance with the present invention can advantageously improve their durability and reliability.

In considering an array of links 44 that are all electrically conductive, or with respect to any arrangement of a plurality of electrically conductive links, such as illustrated, each link 44 of the plurality of electrically conductive links is electrically isolated or distinct from the other electrically conductive links in accordance with the present invention. That is, each of the conductive portions 46 of the plurality of links 44 is electrically unique. However, the links 44 are not required to be distinct as any plurality of links can be commonly conductive with one or more others and any number of plural links can be interconnected to form common electrical, thermal, and/or mechanical connection paths or traces depending on the particular application.

As shown, the links 44 of the interposer 36 may form a regularly arranged area array comprising a grid having rows and columns (four of each illustrated). The links 44 can, however, be arranged in an irregular manner as an area array. Moreover, any number of links 44 can be used. Any desired pattern for the array of links 44 can be used depending on a particular application or desired use for the interposer 36. For example, the array of links 44 can be designed to comprise a land grid array, a ball grid array, or a column grid array or combinations thereof. The first and second vias, 48 and 50, can be aligned with respect to each other, as shown, or may be offset from each other as described in more detail below with respect to other exemplary interposers in accordance with the present invention. In this way, interposers in accordance with the present invention can be designed to modify the connection pattern between oppositely facing surfaces of an interposer such as to redistribute top peripheral die bonds to a bottom regular array, for example. Generally, a non-offset or aligned interposer design can provide greater X-Y compliance for TCE mismatch as compared in the Z axis compliance. An offset interposer design can provide X-Y compliance for TCE mismatch but with much greater Z axis compliance for interface flexure caused by acceleration, shock, and vibration.

As shown, the first and second vias, 48 and 50, comprise circularly shaped openings with sidewalls that are generally perpendicular to the first and second surfaces, 40 and 42, of the substrate 38 of the interposer 36. As described below, such sidewalls may instead be angularly oriented with respect a surface of an interposer. An angled design reduces the probability of air entrapment and voiding where the via sidewall meets the via base, which via base is preferably comprises a portion of the buried conductive portion. Also, while circularly shaped vias are preferred to accommodate solder balls or bumps, such vias can have any desired shape. Preferably vias, 48 and 50, are designed so that such vias can at least partially receive a solder or polymer bump that can provide an array of mechanical, electrical, and/or thermal bonds between the conductive portions 46 of the links 44 and one or more components of a microelectronic device assembly as described in more detail below.

The interposer 36, as well as the other exemplary interposers in accordance with the present invention described and suggested below, can be fabricated by any known or future developed processes or techniques capable of providing a conductive portion buried in a substrate material and an opening or via for accessing such conductive portion. For example, any known or future developed coating, photolithographic patterning, and laminating techniques can be used. A pattern of conductive traces can be formed on a substrate by conventional deposition, photolithography, and etching techniques and a lamination process can be used to bond the substrate to another substrate, foil, film, or the like. Vias can be formed by laser drilling, wet etching, dry etching, or the like with appropriate photolithography techniques. One technique that can be used to form vias for interposers in accordance with the present invention is the DYCOstrate plasma etching/drilling process known as the "DYCOstrate" process as available from DYCONEX Ltd. of Basserdorf, Switzerland.

Figure 5:
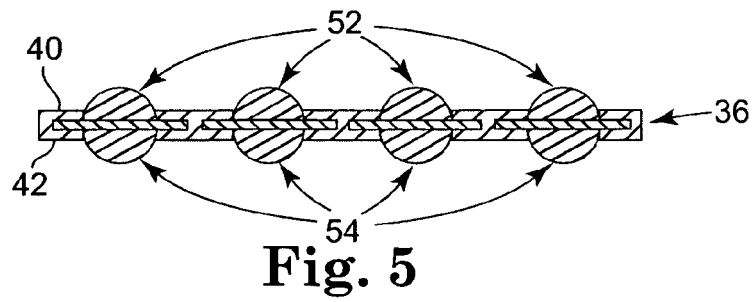
FIG. 5 is a cross-sectional view of the interposer of FIG. 3 taken along the line 4-4 with the addition of solder or polymer bumps attached to the conductive buried portion on each side of the substrate as part of the link between opposite sides of the substrate.
Figure 6:
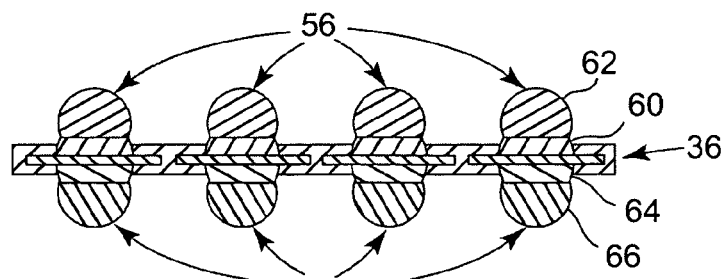
FIG. 6 is a cross-sectional view of the interposer of FIG. 3 taken along the line 4-4 with the addition of solder or polymer balls attached to the conductive buried portion on each side of the substrate as part of the link between opposite sides of the substrate.

In FIG. 5, the interposer 36 of FIG. 3 is shown in cross-section taken along the line 4-4, wherein each of the plurality of links 44 is further illustrated with first and second bumps, 52 and 54 as they can be directly adhered to the conductive portion 46. Bumps 52 and 54 may comprise solder or polymer bumps and can be designed to function to provide an electrical, thermal, and/or mechanical bond to a component of a microelectronic device assembly with respect to the first and second surfaces 40 and 42, respectively, of the substrate 38 of the interposer 36. In FIG. 6 the interposer 36 of FIG. 3 is shown in cross-section taken along the line 4-4 wherein each of the links 44 is further illustrated with first and second ball assemblies 56 and 58. A first ball assembly 56 comprises fillet 60 and ball 62 and a second ball assembly 58 comprises fillet 64 and ball 66. The fillets 60 and 64 and balls 62 and 66 may comprise solder or polymer or combinations thereof. By providing plural connections as ball assemblies, a taller overall link can be provided as compared with bumps. The increased height of such a stacked ball and filled design can improve compliance in the X-Y directions and thus improve thermal coefficient mismatch tolerance between connected components. Techniques that can be used to form a solder or polymer bump on an attach pad in accordance with the present invention are described in U.S. Pat. No. 6,414,248 to Sundstrom and assigned to the assignee of the present application, the entire disclosure of which is incorporated herein by reference for all purposes.

Figure 7:
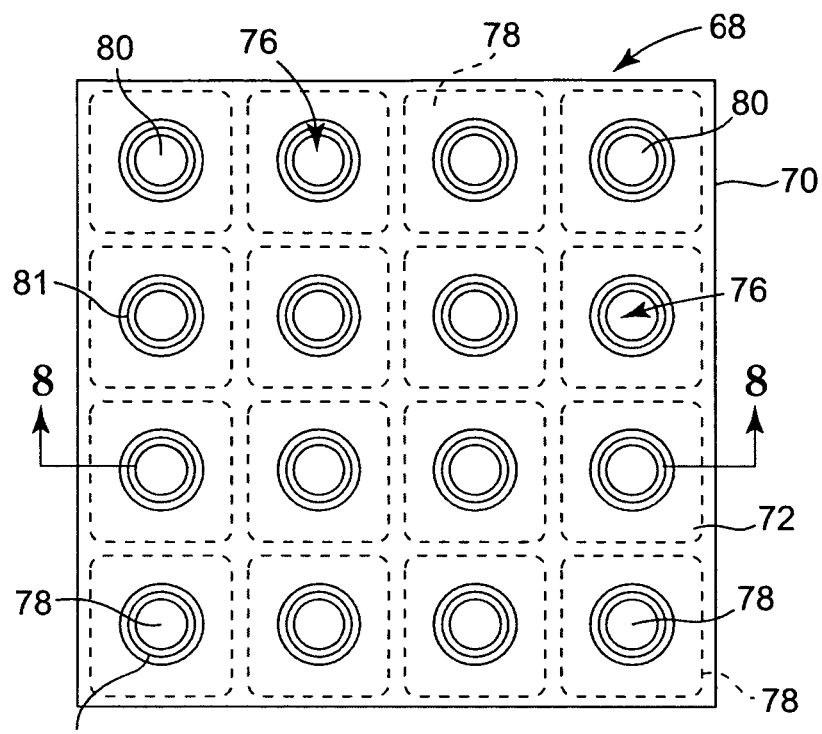
FIG. 7 is a plan view of an interposer in accordance with the present invention that can be used in the microelectronic device assembly of FIG. 2 wherein the interposer comprises a substrate having a plurality of distinct links between aligned via attach pad locations on opposite sides of the substrate and the links are arranged as an array and each link comprises a conductive portion buried in the substrate and a via attach pad in substantial electrical and thermal contact with the buried conductive portion.
Figure 8:
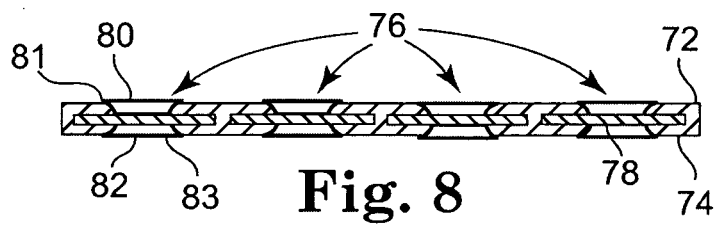
FIG. 8 is a cross-sectional view of the interposer of FIG. 7 taken along the line 8-8.

Another exemplary interposer 68 in accordance with the present invention is illustrated in FIGS. 7 and 8. In FIG. 7 the interposer 68 is shown in plan view and in FIG. 8 a cross-sectional view of the interposer 68 taken along the line 8-8 is provided. The interposer 68 generally comprises a substrate 70 having a first surface 72, a second surface 74, and a plurality of links 76 traversing between the first and second surfaces 72 and 74, respectively. The interposer 68 is different from the interposer 36 described above in that the interposer 68 includes vias that comprise tapered sidewalls and that provide an attach pad on a surface of the interposer 68 as described below in more detail.

As shown, each link 76 of the plurality of links comprises a conductive portion 78 buried in the substrate 70 and positioned between the first and second surfaces 72 and 74, respectively, of the substrate 70, a first conductive via 80 extending from the first surface 72 of the substrate 70 to the buried conductive portion 78, and a second conductive via 82 extending from the second surface 74 of the substrate 70 to the conductive portion 78. Preferably, the buried conductive portions 78 are designed as described above with respect to the conductive portions 46 of the interposer 36 and comprise a buried or embedded conductive material. Also, such a buried conductive portion 78 of a link 76 is preferably designed so that the buried conductive portion 78 is larger than the first and second vias 80 and 82, respectively, as described above with respect to the buried conductive portions 46 of the interposer 36.

Preferably, and as illustrated, each link 76 of the plurality of links is electrically distinct from the other links in accordance with the present invention. That is, each of the conductive portions 78 of the plurality of links 76 is electrically unique. However, the links 76 are not required to be distinct and any number of plural links can be commonly interconnected.

As shown, the links 76 of the interposer 68 form a regularly arranged area array comprising a grid having rows and columns. The links 76 can, however, be arranged in an irregular manner as an area array as noted above. Moreover, any number of links 76 can be used. Any desired pattern for the array of links 76 can be used depending on a particular application or desired use for the interposer 68. For example, the array of links 76 can be designed to comprise a land grid array, a ball grid array, or a column grid array. The first and second vias, 80 and 82, can be aligned with respect to the first and second surfaces, 72 and 74, of the interposer 68, as shown, or may be offset from each other as described in more detail below with respect to other exemplary interposers in accordance with the present invention.

As shown, the first and second vias 80 and 82, respectively, can comprise circularly shaped openings with sidewalls that are generally angularly oriented with respect to the first and second surfaces 72 and 74, respectively, of the substrate 70 of the interposer 68. Also, as shown, an opening of a via at the surface 72 of the substrate 70 is preferably larger at such surface 72 than at the base of such via which comprises a surface portion of the buried conductive portion 78. In this way, a via can be created that comprises a conically shaped sidewall. Also, while circularly shaped vias are preferred, such vias can have any desired shape. As illustrated, the sidewalls of each of the vias 80 and 82 are preferably metallized, which preferably defines an attach pad 81 for the first via 80 and an attach pad 83 for the second via 82. As shown, each of vias 80 and 82, comprises a blind via that starts at the respective attach pad, 81 and 83, and extends to the buried conductive portion 78. Preferably vias 80 and 82, including the attach pads 81 and 83, are designed so that such vias can at least partially receive a solder or polymer bump or ball that can provide an array of mechanical, electrical, and/or thermal bonds between the conductive portions 78 of the links 76 and one or more components of a microelectronic device assembly.

Figure 9:
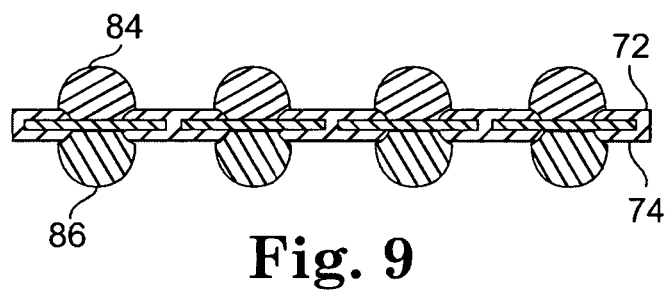
FIG. 9 is a cross-sectional view of the interposer of FIG. 7 taken along the line 8-8 with the addition of solder or polymer bumps attached to the conductive via attach pad and buried portion on each side of the substrate as part of the link between opposite sides of the substrate.
Figure 10:
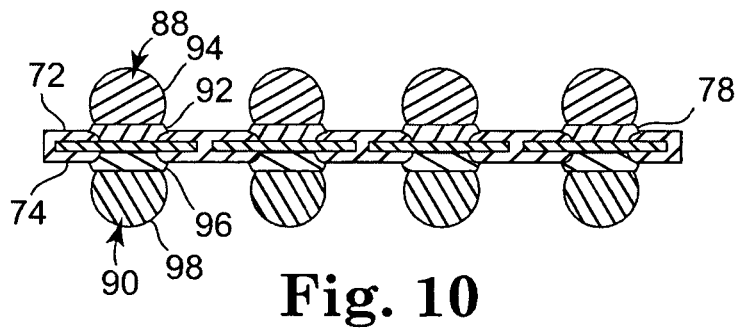
FIG. 10 is a cross-sectional view of the interposer of FIG. 7 taken along the line 8-8 with the addition of solder or polymer balls attached to the conductive via attach pad and buried portion on each side of the substrate as part of the link between opposite sides of the substrate.

In FIG. 9 the interposer 68 of FIG. 7 is shown in cross-section along the line 8-8 wherein each of the plurality of links 76 is further illustrated with first and second bumps, 84 and 86. Bumps 84 and 86 may comprise solder or polymer bumps and are designed to function to provide a bond to a component of a microelectronic device assembly with respect to the first and second surfaces 72 and 74, respectively, of the substrate 70 of the interposer 68. In FIG. 10 the interposer 36 of FIG. 7 is shown in cross-section wherein each of the links 76 further comprises first and second ball assemblies 88 and 90, respectively. The first ball assembly 88 comprises fillet 92 and ball 94 and the second ball assembly 90 comprises fillet 96 and ball 98. The fillets 92 and 96 and balls 94 and 98 may comprise solder or polymer or combinations thereof as noted above.

Figure 11:
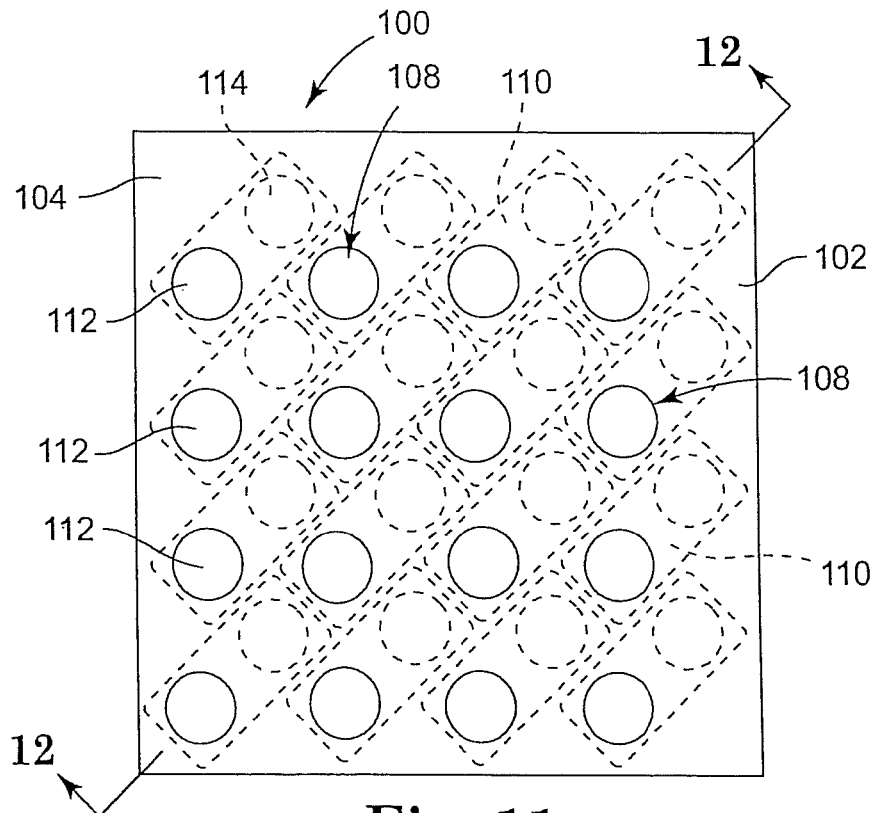
FIG. 11 is a plan view of an interposer in accordance with the present invention that can be used in the microelectronic device assembly of FIG. 2 wherein the interposer comprises a substrate having a plurality of distinct links between offset attach pad locations on opposite sides of the substrate and the links are arranged as an array and each comprises a conductive portion buried in the substrate.
Figure 12:
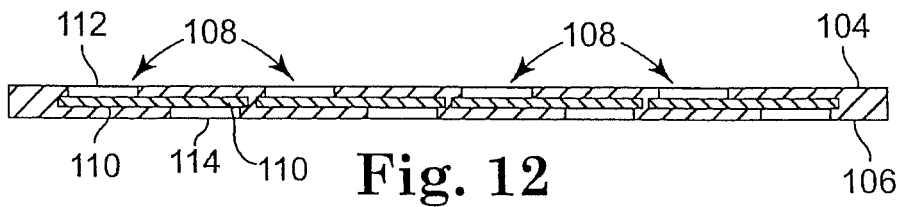
FIG. 12 is a cross-sectional view of the interposer of FIG. 11 taken along the line 12-12.

Another exemplary interposer 100 in accordance with the present invention is illustrated in FIGS. 11 and 12. In FIG. 11 the interposer 100 is shown in plan view and in FIG. 12 a cross-sectional view of the interposer 100 along the line 12-12 is provided. The interposer 100 generally comprises a substrate 102 having a first surface 104, a second surface 106, and a plurality of links 108 traversing between the first and second surfaces, 104 and 106. The interposer 100 is generally different from the interposers 36 and 68 described above in that the interposer 100 comprises a plurality of first and second vias that are offset from each other as described below.

As shown, each link 108 of the plurality of links comprises a conductive portion 110 buried in the substrate 102 and positioned between the first and second surfaces, 104 and 106, of the substrate 102, a first via 112 extending from the first surface 104 of the substrate 102 to the buried conductive portion 110, and a second via 114 extending from the second surface 106 of the substrate 102 to the buried conductive portion 110. Preferably, the conductive portions 110 are designed as described above with respect to the conductive portions 46 of the interposer 36 and comprise a buried or embedded conductive material. Also, such a buried conductive portion 110 of a link 108 is preferably designed so that the buried conductive portion 110 is larger than the first and second vias, 112 and 114, respectively, as described above with respect to the buried conductive portions 46 of the interposer 36.

Preferably, and as illustrated, each link 108 of the plurality of links is electrically distinct from the other links in accordance with the present invention. That is, each of the conductive portions 110 of the plurality of links 108 is electrically unique. However, the links 108 are not required to be distinct and any number of plural links can be interconnected.

As shown, the links 108 of the interposer 100 form a regularly arranged area array on each side of the interposer 100 comprising a grid having four rows and four columns. The links 108 can, however, be arranged in an irregular manner as an area array as noted above. Moreover, any number of links 108 can be used. Any desired pattern for the array of links 108 can be used depending on a particular application or desired use for the interposer 100. For example, the array of links 108 can be designed to comprise a land grid array, a ball grid array, or a column grid array. The first and second vias, 112 and 114, are preferably offset from each other as shown.

As shown, the first and second vias, 112 and 114, comprise circularly shaped openings with sidewalls that are generally perpendicularly oriented with respect to the first and second surfaces, 104 and 106, of the substrate 102 of the interposer 100. Also, while circularly shaped vias are preferred, such vias can have any desired shape. Preferably vias, 112 and 114, are designed so that such vias can at least partially receive a solder or polymer bump or ball that can provide an array of mechanical, electrical, and/or thermal bonds between the conductive portions 110 of the links 108 and one or more components of a microelectronic device assembly.

Figure 13:
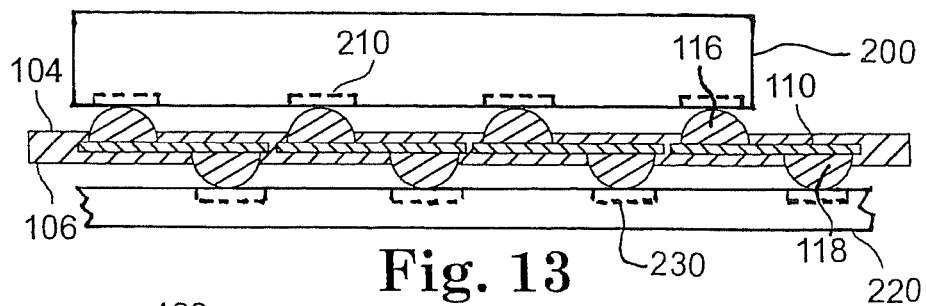
FIG. 13 is a cross-sectional view of the interposer of FIG. 11 taken along the line 12-12 with the addition of solder or polymer bumps attached to the conductive buried portion on each side of the substrate as part of the link between opposite sides of the substrate.
Figure 14:
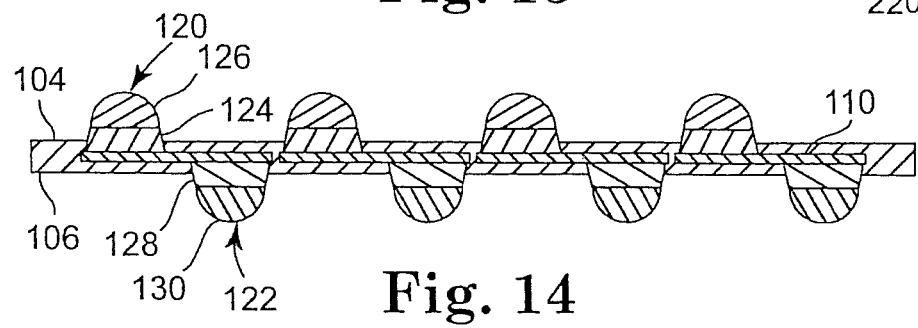
FIG. 14 is a cross-sectional view of the interposer of FIG. 11 taken along the line 12-12 with the addition of solder or polymer balls attached to the conductive buried portion on each side of the substrate as part of the link between opposite sides of the substrate.

In FIG. 13 the interposer 100 of FIG. 11 is shown in cross-section along the line 12-12 wherein each of the plurality of links 108 further comprises first and second bumps, 116 and 118. Bumps 116 and 118 may comprise solder or polymer bumps and function to provide a bond to a component of a microelectronic device assembly with respect to the first and second surfaces, 104 and 106, of the substrate 102 of the interposer 100. For example, the microelectronic device assembly can include a first microelectronic component 200 having a plurality of attach pads 210, and a second microelectronic component 220 having a plurality of attach pads 230. The first microelectronic component 200 can be a bare or packaged IC chip, and the second microelectronic component 220 can be an electronic package or a printed circuit board. The interposer is positioned between the first and second microelectronic components 200, 220. The bumps 116 are connected to attach pads 210, and bumps 118 are connected to attach pads 230. In FIG. 14 the interposer 100 of FIG. 11 is shown in cross-section wherein each of the links 108 further comprises first and second ball assemblies, 120 and 122. The first ball assembly 120 comprises fillet 124 and ball 126 and the second ball assembly 122 comprises fillet 128 and ball 130. The fillets 124 and 128 and balls 126 and 130 may comprise solder or polymer or combinations thereof as noted above.

Figure 15:
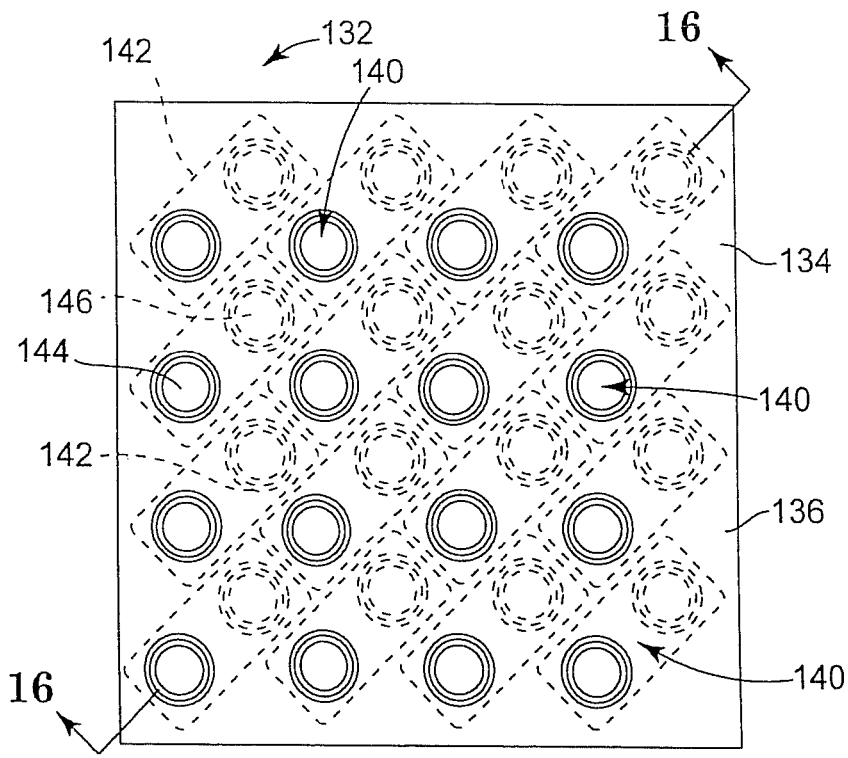
FIG. 15 is a plan view of an interposer in accordance with the present invention that can be used in the microelectronic device assembly of FIG. 2 wherein the interposer comprises a substrate having a plurality of distinct links between offset via attach pads locations on opposite sides of the substrate and the links are arranged as an array and each comprises a conductive portion buried in the substrate and a via attach pad in substantial electrical and thermal via contact with the conductive portion.
Figure 16:
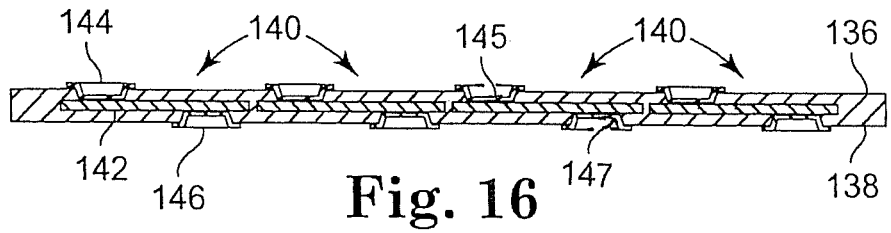
FIG. 16 is a cross-sectional view of the interposer of FIG. 15 taken along the line 16-16.

Another exemplary interposer 132 in accordance with the present invention is illustrated in FIGS. 15 and 16. In FIG. 15 the interposer 132 is shown in plan view and in FIG. 16 a cross-sectional view of the interposer 132 taken along line 16-16 is provided. The interposer 132 generally comprises a substrate 134 having a first surface 136, a second surface 138, and a plurality of links 140 traversing between the first and second surfaces, 136 and 138.

As shown, each link 140 of the plurality of links comprises a conductive portion 142 buried in the substrate 134 and positioned between the first and second surfaces, 136 and 138, of the substrate 134, a first via 144 extending from the first surface 136 of the substrate 134 to the conductive portion 142, and a second via 146 extending from the second surface 138 of the substrate 134 to the conductive portion 142. Preferably, the conductive portions 142 are designed as described above with respect to the conductive portions 46 of the interposer 36 and comprise a conductive material. Also, such a buried conductive portion 142 of a link 140 is preferably designed so that the buried conductive portion 142 is larger than the first and second vias, 144 and 146, respectively, as described above with respect to the buried conductive portions 46 of the interposer 36.

Preferably, and as illustrated, each link 140 of the plurality of links is electrically distinct from the other links in accordance with the present invention. That is, each of the conductive portions 142 of the plurality of links 140 is electrically unique. However, the links 140 are not required to be distinct and any number of plural links can be interconnected.

As shown, the links 140 of the interposer 132 form a regularly arranged area array on each side of the interposer 132 comprising a grid having four rows and four columns. The links 140 can, however, be arranged in an irregular manner as an area array as noted above. Moreover, any number of links 140 can be used. Any desired pattern for the array of links 140 can be used depending on a particular application or desired use for the interposer 132. For example, the array of links 140 can be designed to comprise a land grid array, a ball grid array, or a column grid array. The first and second vias, 144 and 146, are offset from each other as shown.

As shown, the first and second vias, 144 and 146, comprise circularly shaped openings with sidewalls that are generally angularly oriented with respect to the first and second surfaces, 136 and 138, of the substrate 134 of the interposer 132. Also, as shown, the opening of a via at a surface of the substrate 134 is preferably larger at such surface of the substrate 134 than the base of such via at the conductive portion 142. In this way, a via, as illustrated, comprises a conically shaped sidewall. Also, while circularly shaped vias are preferred, such vias can have any desired shape. As illustrated, the sidewalls of each of the vias, 144 and 146, are preferably metallized, which preferably defines an attach pad 145 for the first via 144 and an attach pad 147 for the second via 146. Preferably vias, 144 and 146, including the attach pads 145 and 147, are designed so that such vias can at least partially receive a solder or polymer bump or ball that can provide an array of mechanical, electrical, and/or thermal bonds between the conductive portions 142 of the links 140 and one or more components of a microelectronic device assembly.

Figure 17:
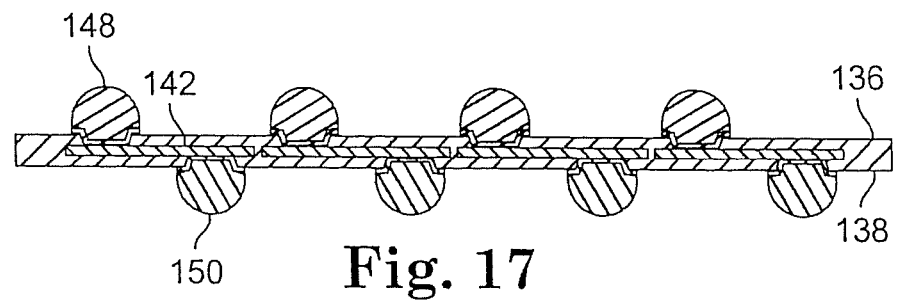
FIG. 17 is a cross-sectional view of the interposer of FIG. 15 taken along the line 16-16 with the addition of solder or polymer bumps attached to the conductive via attach pad and buried portion on each side of the substrate as part of the link between opposite sides of the substrate.
Figure 18:
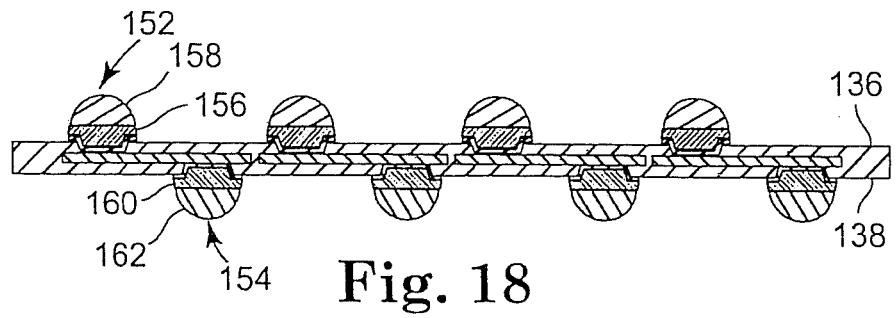
FIG. 18 is a cross-sectional view of the interposer of FIG. 15 taken along the line 16-16 with the addition of solder or polymer balls attached to the conductive via attach pad and buried portion on each side of the substrate as part of the link between opposite sides of the substrate.

In FIG. 17 the interposer 132 of FIG. 15 is shown in cross-section taken along the line 16-16 wherein each of the plurality of links 140 further comprises first and second bumps, 148 and 150. Bumps 148 and 150 may comprise solder or polymer and function to provide a bond to a component of a microelectronic device assembly with respect to the first and second surfaces, 136 and 138, of the substrate 134 of the interposer 132. In FIG. 18 the interposer 132 of FIG. 15 is shown in cross-section taken along the line 16-16 wherein each of the links 140 further comprises first and second ball assemblies, 152 and 154. The first ball assembly 152 comprises fillet 156 and ball 158 and the second ball assembly 154 comprises fillet 160 and ball 162. The fillets 156 and 160 and balls 158 and 162 may comprise solder or polymer or combinations thereof as noted above.

Figure 19:
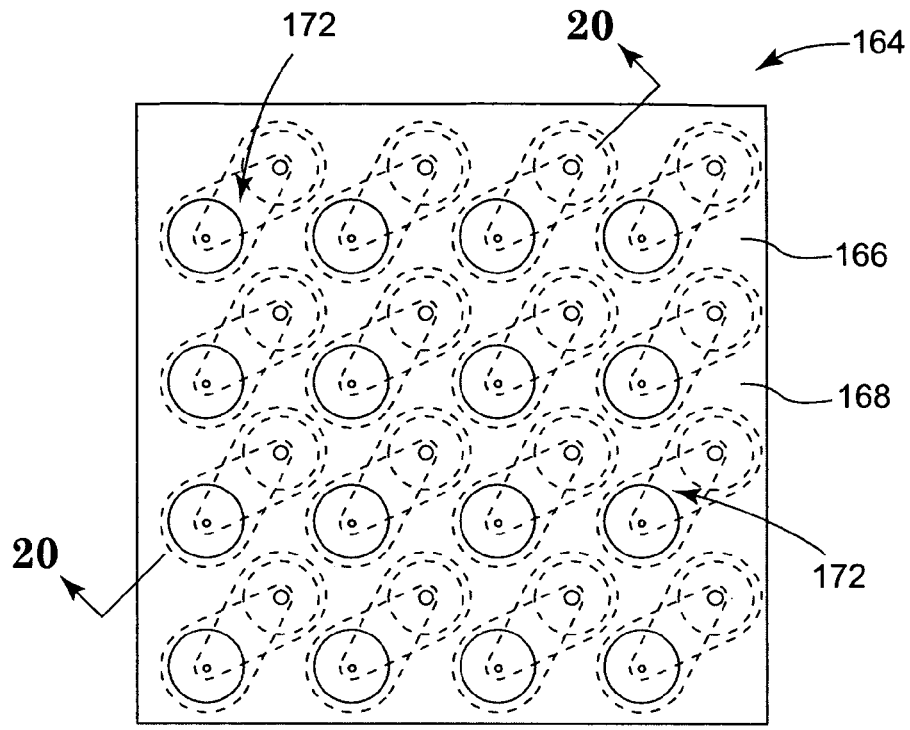
FIG. 19 is a plan view of an interposer in accordance with the present invention that can be used in the microelectronic device assembly of FIG. 2 wherein the interposer comprises a substrate having a plurality of distinct links between offset attach pad locations on opposite sides of the substrate and the links are arranged as an array and each comprises plural conductive portions buried in the substrate and an attach pad in substantial electrical and thermal contact with the buried conductive portions.
Figure 20:
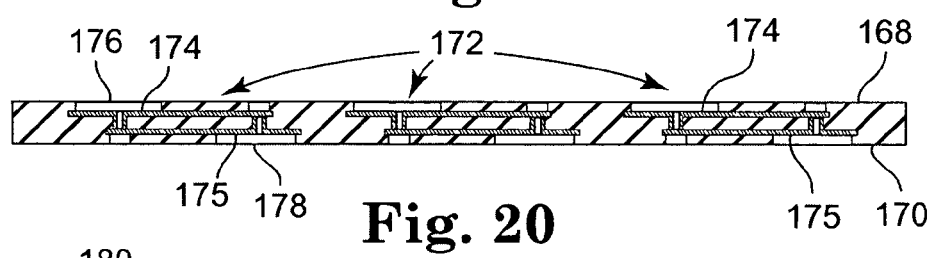
FIG. 20 is a cross-sectional view of the interposer of FIG. 19 taken along the line 20-20.

Another exemplary interposer 164 in accordance with the present invention is illustrated in FIGS. 19 and 20. In FIG. 19 the interposer 164 is shown in plan view and in FIG. 20 a cross-sectional view of the interposer 164 taken along the line 20-20 is provided. The interposer 164 generally comprises a substrate 166 having a first surface 168, a second surface 170, and a plurality of links 172 traversing between the first and second surfaces, 168 and 170.

As shown, each link 172 of the plurality of links comprises first and second spaced conductive portions, 174 and 175, buried in the substrate 166 and positioned between the first and second surfaces, 168 and 170, of the substrate 166, a first via 176 extending from the first surface 168 of the substrate 166 to the conductive portions 174 and 175, and a second via 178 extending from the second surface 170 of the substrate 166 to the conductive portions 175 and 174. Preferably, the conductive portions 174 and 175 are designed as described above with respect to the conductive portions 46 of the interposer 36 and each comprises a buried or embedded conductive material. Also, such buried conductive portions 174 and 175 of a link 172 are preferably designed so that the buried conductive portions 174 and 175 are larger than the first and second vias, 176 and 178, respectively, as described above with respect to the buried conductive portions 46 of the interposer 36. 5 Preferably, and as illustrated, each link 172 of the plurality of links is electrically distinct from the other links in accordance with the present invention. That is, each of the conductive portions 174 and 175 of the plurality of links 172 is electrically unique. However, the links 76 are not required to be distinct and any number of plural links can be interconnected.

As shown, the links 172 of the interposer 164 form a regularly arranged area array on each side of the interposer comprising a grid having four rows and four columns. The links 172 can, however, be arranged in an irregular manner as an area array as noted above. Moreover, any number of links 172 can be used. Any desired pattern for the array of links 172 can be used depending on a particular application or desired use for the interposer 164. For example, the array of links 172 can be designed to comprise a land grid array, a ball grid array, or a column grid array. Additionally, the first and second vias, 176 and 178, are offset from each other as shown.

As shown, the first and second vias, 176 and 178, comprise circularly shaped openings with sidewalls that are generally perpendicularly oriented with respect to the first and second surfaces, 168 and 170, of the substrate 166 of the interposer 164. Also, while circularly shaped vias are preferred, such vias can have any desired shape. Preferably vias, 176 and 178, are designed so that such vias can at least partially receive a solder or polymer that can provide an array of mechanical, electrical, and/or thermal bonds between the conductive portions 174 and 175 of the links 172 and one or more components of a microelectronic device assembly.

Figure 21:
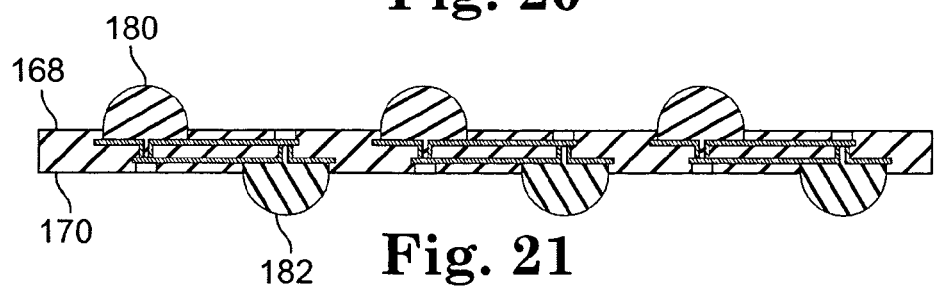
FIG. 21 is a cross-sectional view of the interposer of FIG. 19 taken along the line 20-20 with the addition of solder or polymer bumps attached to the conductive buried portion on each side of the substrate as part of the link between opposite sides of the substrate.
Figure 22:
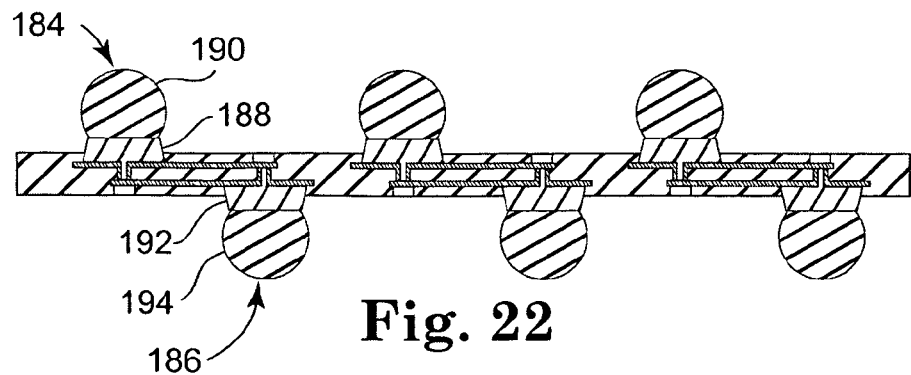
FIG. 22 is a cross-sectional view of the interposer of FIG. 19 taken along the line 20-20 with the addition of solder or polymer balls attached to the conductive buried portion on each side of the substrate as part of the link between opposite sides of the substrate.

In FIG. 21 the interposer 164 of FIG. 19 is shown in cross-section taken along the line 20-20 wherein each of the plurality of links 172 further comprises first and second bumps, 180 and 182. Bumps 180 and 182 may comprise solder or polymer and function to provide a bond to a component of a microelectronic device assembly with respect to the first and second surfaces, 168 and 170, of the substrate 166 of the interposer 164. In FIG. 22 the interposer 164 of FIG. 19 is shown in cross-section taken along the line 20-20 wherein each of the links 172 further comprises first and second ball assemblies, 184 and 186. The first ball assembly 184 comprises fillet 188 and ball 190 and the second ball assembly 186 comprises fillet 192 and ball 194. The fillets 188 and 192 and balls 190 and 194 may comprise solder or polymer or combinations thereof as noted above.

The present invention has now been described with reference to several embodiments thereof. The entire disclosure of any patent or patent application identified herein is hereby incorporated by reference. The foregoing detailed description and examples have been given for clarity of understanding only. No unnecessary limitations are to be understood therefrom. It will be apparent to those skilled in the art that many changes can be made in the embodiments described without departing from the scope of the invention. Thus, the scope of the present invention should not be limited to the structures described herein, but only by the structures described by the language of the claims and the equivalents of those structures.

What is claimed is:

1. An interposer comprising:
   a dielectric substrate having first and second oppositely facing surfaces, the dielectric substrate having a unitary structure of a flexible material; and
   a plurality of distinct links arranged as an array, each link comprising:
      a conductive portion buried in the dielectric substrate and located at a predetermined position between the first and second surfaces of the dielectric substrate;
      a first via formed in the dielectric substrate, the first via extending from the first surface of the dielectric substrate to the conductive portion; and
      a second via formed in the dielectric substrate, the second via extending from the second surface of the dielectric substrate to the conductive portion and having a predetermined alignment with the first via;
      wherein the conductive portion has a substantially rectangular boundary that is larger than the first and second vias;
   wherein the interposer is configured to connect to at least one electronic device comprising an integrated circuit with at least one attach pad for interfacial coupling to the interposer to produce a z-axis mechanical compliance for interfacial flexure between the electronic device interfacial attach pad and a host substrate interfacial attach pad.

2. The interposer of claim 1, wherein the conductive portion of at least one link comprises a metal layer buried in the dielectric substrate.

3. The interposer of claim 1, wherein at least one of the first and second vias of at least one link decreases in size as the at least one of the first and second vias extends from the first surface of the dielectric substrate to the conductive portion.

4. The interposer of claim 1, wherein a central axis of the first via of at least one link overlaps with a central axis of the second via of the at least one link.

5. The interposer of claim 1, wherein a central axis of the first via of at least one link is spaced from a central axis of the second via of the at least one link.

6. The interposer of claim 1, wherein at least one of the first and second vias of at least one link comprises an attach pad, the attach pad comprising a first portion provided on a surface of the dielectric substrate and a second portion electrically connected to the conductive portion of the at least one link.

7. The interposer claim 1, wherein at least one of the first and second vias of at least one link comprises an attach pad, the attach pad comprising an exposed portion of the conductive portion of the at least one link.

8. The interposer of claim 1, wherein the interposer is in combination with and electrically connected to a microelectronic component.

9. The combination of claim 8, wherein the interposer is electrically connected to the microelectronic component with an area array.

10. The combination of claim 9, wherein the area array comprises a regularly arranged grid.

11. The combination of claim 9, wherein the area array comprises an irregularly arranged array.

12. The combination of claim 9, wherein the area array comprises one of a land grid array, a ball grid array, a bump grid array, and a column grid array.

13. The combination of claim 8, further comprising a printed circuit board electrically connected to the interposer.

14. The combination of claim 13, wherein the printed circuit board is electrically connected to the interposer with an area array.

15. The combination of claim 14, wherein the area array comprises a regularly arranged grid.

16. The combination of claim 14, wherein the area array comprises an irregularly arranged array.

17. The combination of claim 14, wherein the area array comprises one of a land grid array, a ball grid array, a bump grid array, and a column grid array.

18. An electronic device assembly, comprising:
   a first electronic device having a plurality of attach pads;
   a second electronic device having a plurality of attach pads;
   an interposer positioned between the first and second electronic devices, the interposer comprising a dielectric substrate having a plurality of distinct links between first and second oppositely facing surfaces of the dielectric substrate, each link of the plurality of links comprising first and second vias electrically connected by an electrically conductive trace buried in the dielectric substrate and positioned between the first and second oppositely facing surfaces of the dielectric substrate, the dielectric substrate having a unitary structure of a flexible material, the electrically conductive trace having a substantially rectangular boundary that is larger than the first and second vias;

at least one first interfacial bond electrically connecting at least one attach pad of the first electronic device to at least one via attach pad at the first surface of the dielectric substrate; and at least one second interfacial bond electrically connecting at least one attach pad of the second electronic device to at least one via attach pad at the second surface of the dielectric substrate;

wherein the at least one attach pad of the first electronic device and the at least one attach pad of the second electronic device are interfacially electrically coupled to the interposer through at least one link of the interposer to produce a z-axis mechanical compliance for interfacial flexure between each of the first and second electronic devices.

19. The electronic device assembly of claim 18, wherein the first electronic device comprises a bare integrated circuit chip and the second electronic device comprises an electronic package.

20. The electronic device assembly of claim 18, wherein the first electronic device comprises a bare integrated circuit chip and the second electronic device comprises a printed circuit board.

21. The electronic device assembly of claim 18, wherein the first electronic device comprises a packaged integrated circuit chip and the second electronic device comprises a printed circuit board.

22. The electronic device assembly of claim 18, wherein the first and second interfacial bonds comprise a regularly arranged grid.

23. The electronic device assembly of claim 18, wherein the first and second interfacial bonds comprise an irregularly arranged array.

24. The electronic device assembly of claim 18, wherein the first and second interfacial bonds comprise one of a land grid array, a ball grid array, a bump grid array, and a column grid array.

25. An electronic device assembly, comprising:
an interposer compnsing:
    a dielectric substrate having first and second oppositely facing surfaces, the dielectric substrate having a unitary structure of a flexible material; and
    a plurality of distinct links arranged as an array, each link comprising:
        a conductive portion buried in the dielectric substrate and located at a predetermined position between the first and second surfaces of the dielectric substrate;
        a first via formed in the dielectric substrate, the first via extending from the first surface of the dielectric substrate to the conductive portion; and
        a second via formed in the dielectric substrate, the second via extending from the second surface of the dielectric substrate to the conductive portion and having a predetermined alignment with the first via; and
    a plurality of connector members coupled to the links, the connector members located at the first and second surfaces of the dielectric substrate and comprising a land grid array or a column grid array; and
at least one electronic device comprising a bare or packaged integrated circuit with a plurality of attach pads interfacially coupled the connector members at the first surface of the dielectric substrate to produce a mechanically compliant connection path between the electronic device attach pads and the connector members at the second surface of the dielectric substrate.

* * * * *